(12) United States Patent
Munson

(10) Patent No.: US 11,348,856 B2
(45) Date of Patent: May 31, 2022

(54) THERMAL COOLING ELEMENT FOR MEMORY DEVICES OF A MEMORY SUB-SYSTEM

(71) Applicant: Micron Technology, Inc., Boise, ID (US)

(72) Inventor: Rolf Thornton Munson, Boulder, CO (US)

(73) Assignee: Micron Technology, Inc., Boise, ID (US)

( * ) Notice: Subject to any disclaimer, the term of this patent is extended or adjusted under 35 U.S.C. 154(b) by 39 days.

(21) Appl. No.: 16/724,084

(22) Filed: Dec. 20, 2019

(65) Prior Publication Data

US 2021/0193553 A1 Jun. 24, 2021

(51) Int. Cl.
| | |
|---|---|
| *H01L 23/367* | (2006.01) |
| *H01L 25/065* | (2006.01) |
| *H01L 23/00* | (2006.01) |
| *H01L 23/373* | (2006.01) |

(52) U.S. Cl.
CPC ........ *H01L 23/3675* (2013.01); *H01L 23/373* (2013.01); *H01L 23/3736* (2013.01); *H01L 24/32* (2013.01); *H01L 25/0655* (2013.01); *H01L 2224/32245* (2013.01); *H01L 2924/1434* (2013.01)

(58) Field of Classification Search
CPC ............... H01L 23/3675; H01L 23/373; H01L 23/3736; H01L 24/32; H01L 25/0655; H01L 2224/32245; H01L 2924/1434
See application file for complete search history.

(56) References Cited

U.S. PATENT DOCUMENTS

| | | | | |
|---|---|---|---|---|
| 5,022,462 | A | * | 6/1991 | Flint ................... H01L 23/4338 165/185 |
| 5,168,348 | A | * | 12/1992 | Chu ....................... H01L 23/367 257/713 |
| 2007/0076381 | A1 | | 4/2007 | Han et al. |
| 2008/0150088 | A1 | * | 6/2008 | Reed ................... H01L 25/0652 257/621 |
| 2008/0282542 | A1 | | 11/2008 | McCutcheon et al. |
| 2013/0049224 | A1 | * | 2/2013 | Sutardja ................ H01L 27/108 257/774 |
| 2014/0362521 | A1 | | 12/2014 | Pronozuk et al. |

FOREIGN PATENT DOCUMENTS

| | | |
|---|---|---|
| KR | 200430269 A | 11/2006 |
| KR | 20170122003 A1 | 11/2017 |

OTHER PUBLICATIONS

PCT International Search Report and Written Opinion for International Application No. PCT/US2020/066244 dated Apr. 22, 2021, 11 pages.

* cited by examiner

*Primary Examiner* — Peniel M Gumedzoe

(74) *Attorney, Agent, or Firm* — Lowenstein Sandler LLP

(57) ABSTRACT

A memory sub-system can include multiple memory devices and a thermal cooling element. The thermal cooling element includes a bottom surface that is coupled to a top surface of each of the memory devices. Furthermore, the thermal cooling element further has a top surface that includes a protrusions that extend above the top surface of the thermal cooling element to dissipate heat that is generated from the memory devices.

18 Claims, 7 Drawing Sheets

THERMAL COOLING ELEMENT FOR MEMORY DEVICES OF A MEMORY SUB-SYSTEM

TECHNICAL FIELD

The present disclosure generally relates to a memory sub-system, and more specifically, relates to a thermal cooling element for memory devices of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
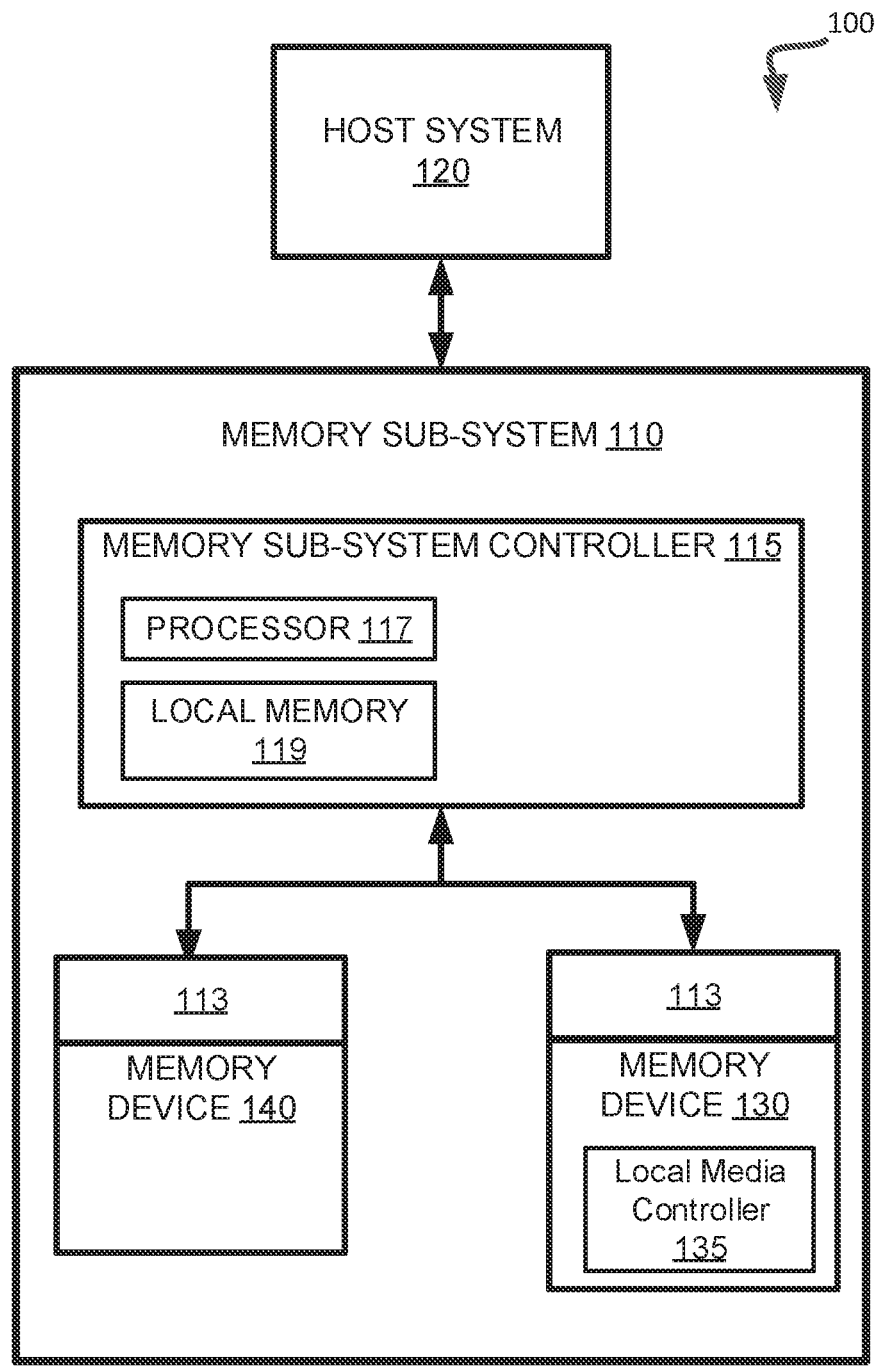
FIG. 1 illustrates an example computing system that includes a memory sub-system in accordance with some embodiments of the present disclosure.

Aspects of the present disclosure are directed to a thermal cooling element for memory devices of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can provide data to be stored at the memory sub-system and can request data to be retrieved from the memory sub-system.

A conventional memory sub-system can include a case that encloses multiple memory devices. For example, the memory sub-system can be covered by a metallic case or enclosure that separates the memory devices of the memory sub-system from an external environment. The case can also be used to provide thermal cooling for the memory devices of the memory sub-system. For example, a thermal pad can couple the memory devices to the metallic case or enclosure so that the metallic case or enclosure is also utilized as a heatsink for the memory sub-system. The heat generated from the memory devices can be dissipated through the contact with the metallic case or enclosure of the memory sub-system.

Certain memory sub-systems, such as a peripheral component interconnect express (PCIe) memory sub-system, have a form factor that does not include a metallic case or enclosure for the memory sub-system. For example, the memory devices of the memory sub-system can be exposed to an external environment since no case or enclosure is used for the memory sub-system. The height of such a form factor can also be more restrictive than the height of conventional memory sub-systems. For example, such memory sub-systems can be used in a computing environment where the available height for the memory sub-system is limited. Since the available height is limited, placing a conventional heatsink or fan above the memory devices to remove any heat generated from the memory devices of the memory sub-system cannot be used. Thus, since no metallic case or enclosure and no conventional heatsink or fan can be used with such memory sub-systems, the heat from the operation of the memory sub-system can remain within the memory sub-system and impact the performance of the memory devices.

Aspects of the present disclosure address the above and other deficiencies by utilizing a thermal cooling element for memory devices of a memory sub-system. The thermal cooling element can be a metallic (or other material capable of transferring heat) tape that is layered above the memory devices of the memory sub-system. The metallic tape can transfer heat from the memory devices towards an end of the metallic tape. For example, heat can be transferred from one of the metallic tape with the memory devices to another end of the metallic tape with no memory devices. Furthermore, the metallic tape can include bumps or other such protrusions to contribute to a steady movement of air over the metallic tape to dissipate the heat from the memory devices. For example, the bumps or protrusions of the metallic tape can ensure that more heat is dissipated from the memory tape.

Advantages of the present disclosure include, but are not limited to, the increased performance of a memory sub-system by improved heat dissipation. For example, since the form factor of the memory sub-system cannot accommodate a metallic case, conventional heatsink, or fan, the metallic tape (i.e., the thermal cooling element) can satisfy the requirements of the form factor while also dissipating heat from the memory devices of the memory sub-system. Thus, the performance of the memory sub-system can be improved since the heat is dissipated from the memory devices.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD).

Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) includes a negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a thermal cooling element 113 that is used to dissipate heat from the memory devices 130 and 140 and/or the memory sub-system controller 115. For example, the thermal cooling element 113 can be coupled to the memory devices 130 and 140 to dissipate heat away from the memory devices 130 and 140 during operation of the memory sub-system 110. Further details with respect to the thermal cooling element are described below.

Figure 2:
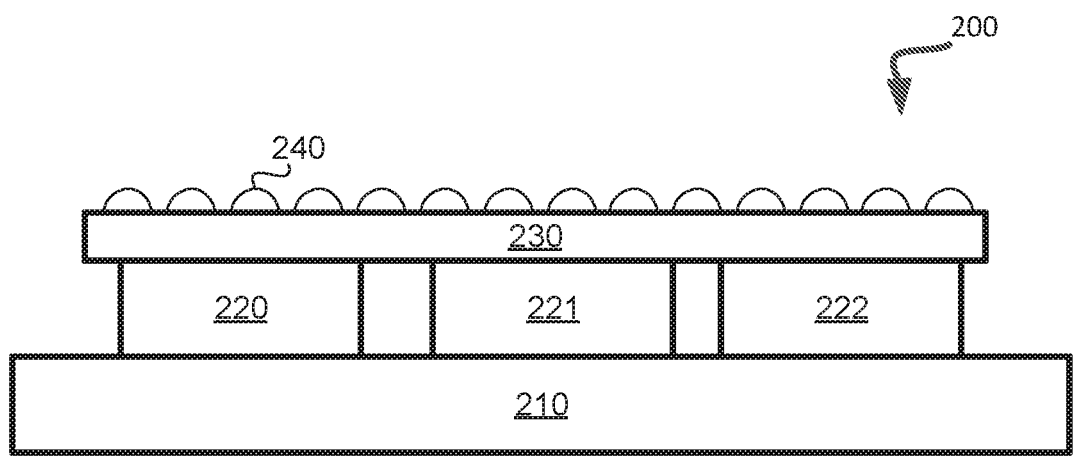
FIG. 2 illustrates an example memory sub-system with a thermal cooling element in accordance with some embodiments.

FIG. 2 illustrates an example memory sub-system 200 with a thermal cooling element in accordance with some embodiments. In general, the memory sub-system 200 can correspond to the memory sub-system 100 of FIG. 1.

The memory sub-system 200 can include memory devices 220, 221, and 222 on a board 210. Examples of the memory devices 220, 221, and 222 include, but are not limited to, non-volatile memory devices and/or volatile memory devices. In some embodiments, one of the memory devices 220, 221, or 222 can be a memory sub-system controller that operates upon the other memory devices that correspond to non-volatile memory devices and volatile memory devices. The board 210 can be a circuit board, logic board, or motherboard upon which the memory devices 220, 221, and 222 are coupled to each other. For example, the board 210 can include connections between the various memory devices 220, 221, and 222.

As shown in FIG. 2, the memory sub-system 200 can further include a thermal cooling element 230 for memory devices 220, 221, and 222. The thermal cooling element 230 can be used to dissipate heat away from the memory devices 220, 221, and 222. For example, during operation of the memory sub-system 200, the memory devices 220, 221, and 222 can each generate heat. The thermal cooling element 230 can be considered a type of heatsink or passive heat exchanging element that transfers the heat generated from the memory devices 220, 221, and 222 to the air that is above the memory sub-system 200. The thermal cooling element 230 can be of any material that can conduct heat. Such materials include, but are not limited to, copper, aluminum, gold, steel, carbon, carbon nanotubes, or any metallic material. In some embodiments, the thermal cooling element 230 can be a copper tape. Alternatively, the thermal cooling element 230 can be an aluminum tape, a steel tape, a carbon tape or the like. According to one example, the thermal cooling element 230 can be a thin metallic material that is less than the height of the memory devices 220, 221, and 222. According to another example, the thermal cooling element 230 can have protrusions spaced between the memory devices 220, 221 and 222 and can be pressed down to the surface of the board 210, which allows for higher protrusions resulting in better cooling, without violating the height restriction of the memory sub-system 200. Various other configurations of the thermal cooling element 230 are possible as well.

The thermal cooling element 230 can be placed on top of the memory devices 220, 221, and 222. For example, the thermal cooling element 230 can be fixed to the memory devices 220, 221, and 222 via a thermal adhesive layer or a thermal glue.

Furthermore, as shown, the thermal cooling element 230 can include multiple elements to create a pattern or texture to the thermal cooling element 230. For example, the thermal cooling element 230 can include multiple bumps 240 that are used to create a turbulent effect for air that passes above the thermal cooling element 230. The bumps 240 can cause air to tumble through the bumps 240 and dissipate additional heat off of the thermal cooling element 230. The heat from the memory devices 220, 221, and 222 can be dissipated off of each bump so that excessive heat from one of the memory devices 220, 221, or 222 does not contribute to the heating of another memory device 220, 221, or 222. For example, for a heatsink that does not include any such bumps 240, the heat can be transferred from one end of the heatsink to another end of the heatsink so that the heat generated from memory device 220 can add to the heat generated from memory device 221, resulting in the memory device 221 becoming excessively hot. However, with the bumps 240, the heat from the memory device 220 can be dissipated by the bumps above the memory device 220 so that less or none of the heat is transferred to the memory device 221.

Although the thermal cooling element 230 is shown with bumps 240, any other type of protrusion or texture can be used with the thermal cooling element 230. The bumps 240 can be spread throughout the length of the thermal cooling element 230. In some embodiments, the bumps 240 can be located at portions above the memory devices 220, 221, and 222 while the portions of the thermal cooling element 230 between the memory devices 220, 221, and 222 do not include the bumps 240 as described in further detail below. Furthermore, the bumps 240 can be of a height to satisfy height requirements of a form factor for the memory sub-system 200. For example, the height of the bumps 240 can be less than that of the memory devices 220, 221, and 222.

As such, the thermal cooling element can include a planar surface (e.g., the copper tape) and multiple protrusions (e.g., the bumps) that extend above the planar surface of the thermal cooling element.

Figure 3:
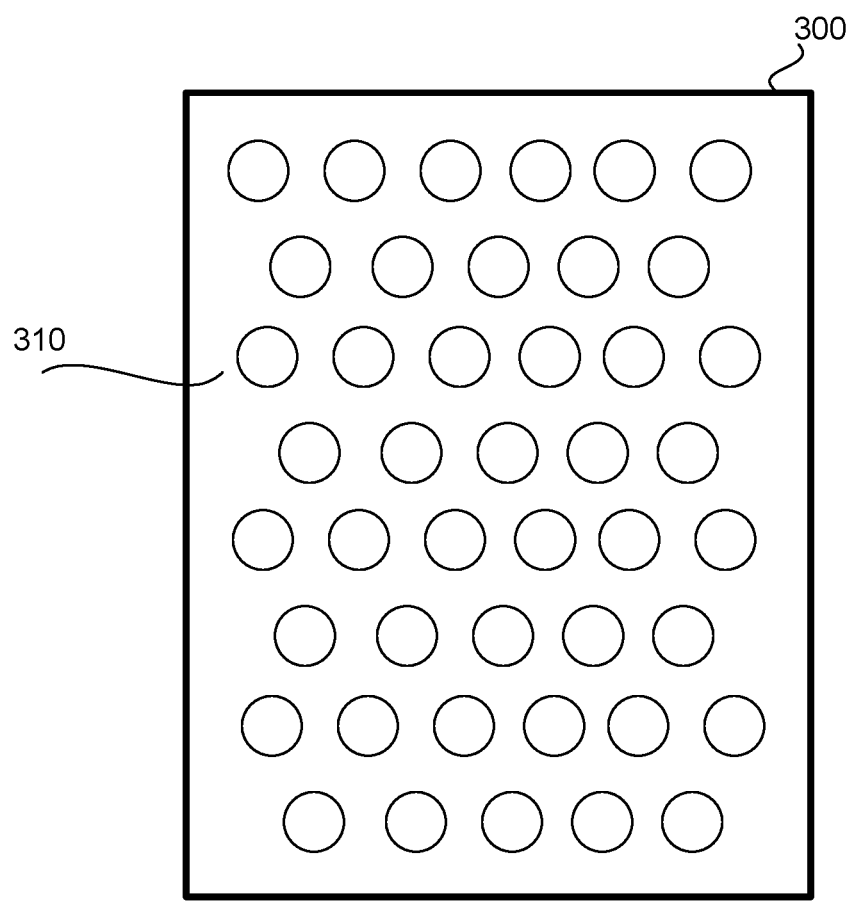
FIG. 3 illustrates an overhead view of an example thermal cooling element in accordance with some embodiments of the present disclosure.

FIG. 3 illustrates an overhead view of an example thermal cooling element 300 in accordance with some embodiments of the present disclosure. In general, a memory sub-system that correspond to the memory sub-system 100 of FIG. 1 can include the thermal cooling element 300.

As previously described, the thermal cooling element 300 can include multiple bumps 310 or other such elements or protrusions. The bumps 310 can be in a pattern that facilitates the transfer of heat from the thermal cooling element 300. For example, the bumps 310 can be in a staggered pattern so that air over the thermal cooling element 300 does not flow in a straight line over the thermal cooling element 300. In some embodiments, the bumps 310 can be in a diamond pattern or in a series of offset rows (i.e., an offset grid pattern) or in any other pattern. In the same or alternative embodiments, the bumps 310 can be in a random pattern on the thermal cooling element 300.

Figure 4:
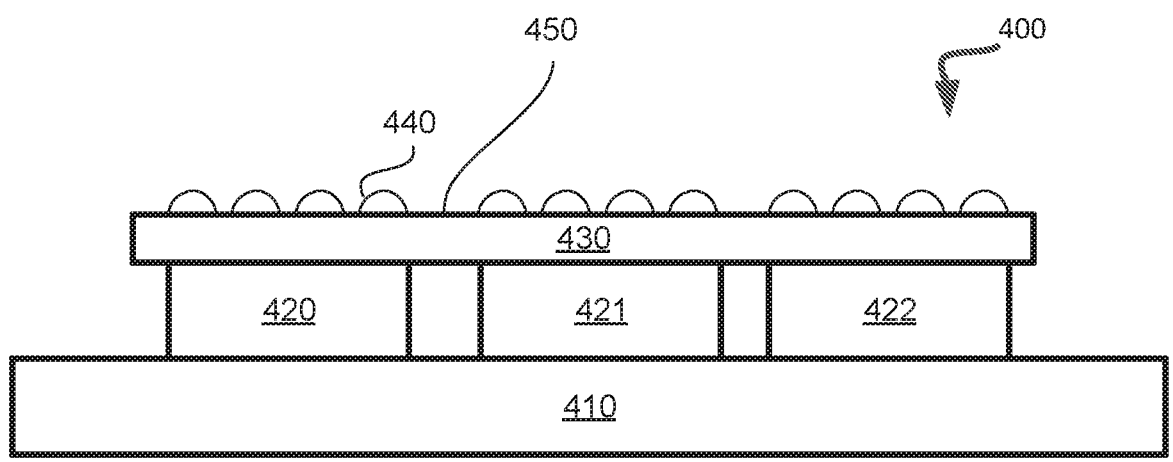
FIG. 4 illustrates another example thermal cooling element for a memory sub-system in accordance with some embodiments.

FIG. 4 illustrates another example thermal cooling element 430 for a memory sub-system 400 in accordance with some embodiments. In general, the memory sub-system 400 can correspond to the memory sub-system 100 of FIG. 1.

As shown in FIG. 4, the memory sub-system 400 can include bumps 440 or other such elements at positions on the thermal cooling element 430 that are directly above the memory devices 420, 421, and 422 on board 410 that may be the same or similar to board 210 of FIG. 2. For example, bumps 440 can be located on the thermal cooling element 430 above the memory device 420 while no bumps are located on the thermal cooling element 430 between the space 450 that separates or is between the memory device 420 and the memory device 421. The bumps 440 can be located at portions above the memory devices 421 and 422 while no bumps are located at portions between the memory devices 421 and 422.

In some embodiments, a material of the thermal cooling element 430 at the spaces 450 (e.g., between the memory devices 420 and 421 and the memory devices 421 and 422) can be made of or constitute a different type of material than the portions of the thermal cooling element 430 that are above the memory devices 420, 421, and 422. For example, as previously mentioned, the thermal cooling element 430 can be a copper tape with bumps 440 where the spaces 450 between memory devices are not made of copper. For example, the portions of the thermal cooling element 430 between the memory devices (e.g., at the space 450) can be made of any type of heat insulating material.

As such, the thermal cooling element 430 can be made of a combination of heat conducting material and heat insulating material. For example, portions of the thermal cooling element 430 that are fixed above the memory devices 420, 421, and 422 can be based on the heat conducting material that includes the bumps 440 while the portions of the thermal cooling element 430 that are not above the memory devices 420, 421, and 422 can be based on the heat insulating material and do not include the bumps 440.

Figure 5:
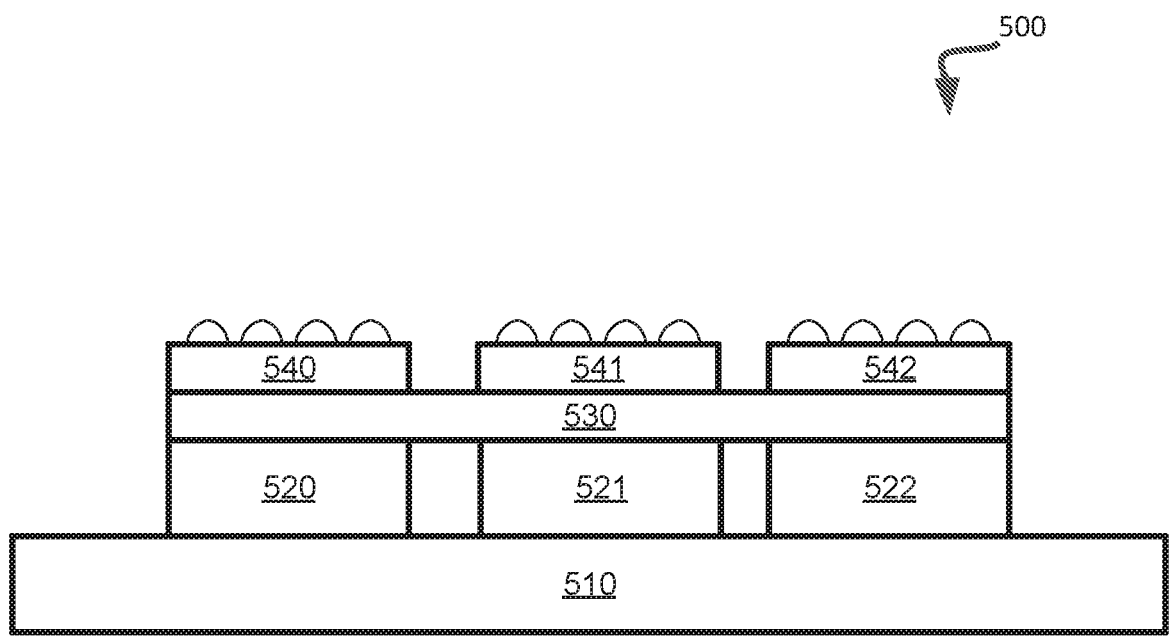
FIG. 5 illustrates another example thermal cooling element for a memory sub-system in accordance with some embodiments.

FIG. 5 illustrates another example thermal cooling element for a memory sub-system 500 in accordance with some embodiments. In general, the memory sub-system 500 can correspond to the memory sub-system 100 of FIG. 1.

As shown in FIG. 5, the thermal cooling element can include an adhesive layer 530 and heat conducting elements 540, 541, and 542 on board 510. Board 510 may be the same or similar to board 210 of FIG. 2. For example, the heat conducting elements 540, 541, and 542 can be a copper tape with bumps or other such texture that are placed on the adhesive layer above the memory devices 520, 521, and 522. Thus, a single adhesive layer 530 can be located across the memory devices 520, 521, and 522 while the heat conducting elements 540, 541, and 542 are coupled to the adhesive layer 530 at locations above the memory devices 520, 521, and 522.

In some embodiments, the heat conducting elements can be based on the memory device below the respective heat conducting element. For example, different memory devices can generate different amounts of heat. In such a case, a heat conducting element above a memory device can be different than another heat conducting element above another memory device. In some embodiments, a memory device that includes a memory sub-system controller can generate a different amount of heat during operation than another memory device that is a non-volatile memory (or a volatile memory). In the same or alternative embodiments, the same thermal cooling element can include different heat conducting elements for different types of memory devices on the same memory sub-system. In some embodiments, different heat conducting elements can be made of different materials or include a different pattern of protrusions where one type of material or pattern dissipates more heat than another type of material or pattern.

Figure 6:
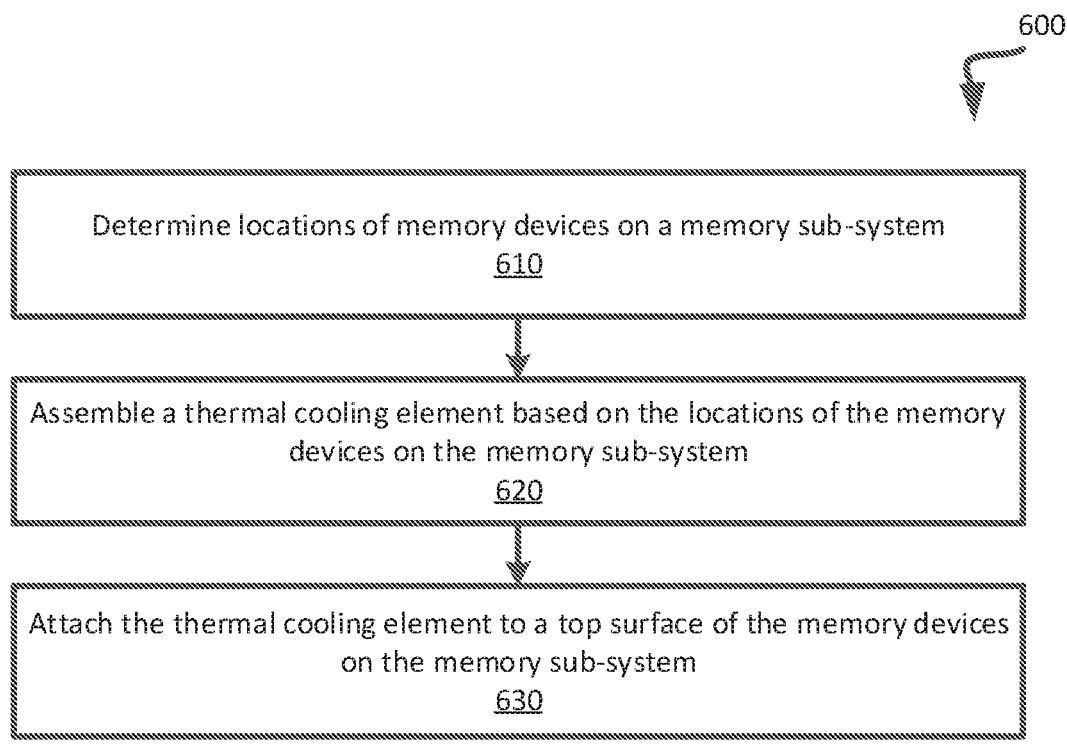
FIG. 6 is an example method to assemble an example thermal cooling element for a memory sub-system in accordance with some embodiments of the present disclosure.

FIG. 6 is a flow diagram of an example method 600 to assemble an example thermal cooling element for a memory sub-system in accordance with some embodiments of the present disclosure. The method 600 can be performed by a machine or processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 6, at operation 610, the processing logic determines locations of memory devices on a memory sub-system. For example, the locations of memory devices on a motherboard of the memory sub-system can be identified. At operation 620, a thermal cooling element can be assembled based on the locations of the memory devices on the memory sub-system. For example, heat conducting elements can be fixed to an adhesive layer based on the locations of the memory devices so that each heat conducting element is above a different memory device. In some embodiments, the adhesive layer can include adhesive surfaces on both sides of the adhesive layer so that one surface of the adhesive layer is fixed to the top surfaces of the different memory devices while another surface of the adhesive layer is fixed to the bottom surfaces of the different heat conducting elements. At operation 630, the processing logic attaches the thermal cooling element to a top surface of the memory devices on the memory sub-system. For example, a manufacturing machine can be used to attach the thermal cooling element with the heat conducting elements to the top surfaces of the memory devices that are located on the motherboard of the memory sub-system.

Figure 7:
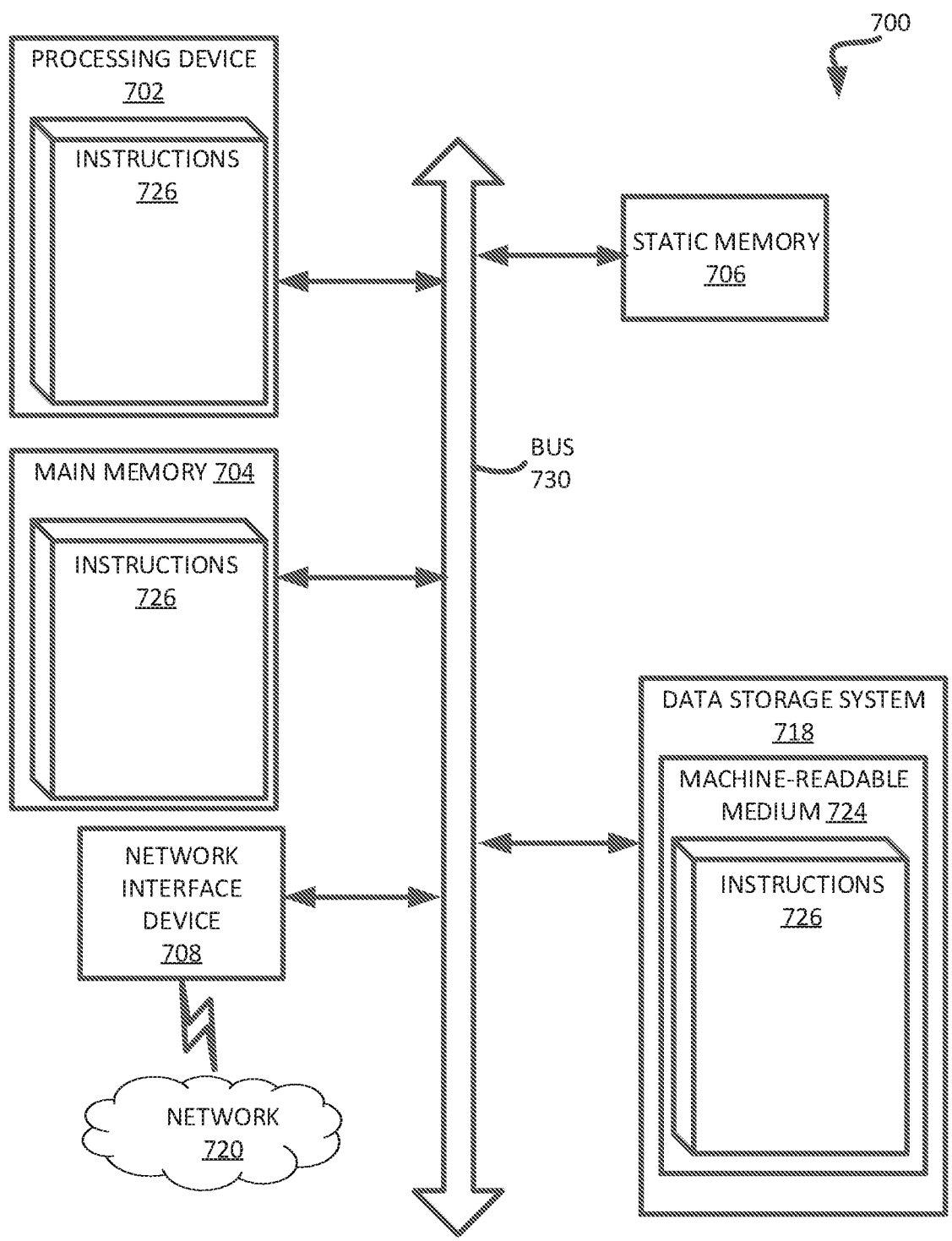
FIG. 7 is a block diagram of an example computer system in which implementations of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to a memory sub-system controller 115 of FIG. 1) or operations of the method 600 of FIG. 6. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to the method 600. While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a plurality of memory devices; and
a thermal cooling element comprising a bottom surface that is coupled to a top surface of each of the plurality of memory devices, and wherein the thermal cooling element further comprises a top surface and a plurality of protrusions connected to the top surface and extending above the top surface of the thermal cooling element, the plurality of protrusions to dissipate heat that is generated from the plurality of memory devices using a plurality of heat conducting elements located underneath the plurality of protrusions, wherein a heat conducting element of the plurality of heat conducting elements is based on a different material than another heat conducting element of the plurality of heat conducting elements.

2. The system of claim 1, wherein the plurality of protrusions are arranged in an offset grid pattern.

3. The system of claim 1, wherein the top surface of the thermal cooling element comprises a portion that is located above a respective memory device of the plurality of memory devices and another portion that is located above a separation between a pair of memory devices of the plurality of memory devices, and wherein the plurality of protrusions are arranged in a pattern that corresponds to protrusions being located at the portion that is located above the respective memory device and no protrusions being located at the another portion that is located above the separation between the pair of memory devices.

4. The system of claim 1, wherein the thermal cooling element further comprises:
a thermal adhesive layer corresponding to the bottom surface that is coupled to the top surface of each of the plurality of memory devices.

5. The system of claim 4, wherein the heat conducting element of the plurality of heat conducting elements is based on a different pattern than another heat conducting element of the plurality of heat conducting elements.

6. The system of claim 1, wherein the thermal cooling element corresponds to at least one of copper tape, aluminum tape, steel tape or carbon tape.

7. A system comprising:
a plurality of memory devices; and
a thermal cooling element comprising:
a planar surface coupled to a top surface of the plurality of memory devices; and
a plurality of protrusions extending above the planar surface of the thermal cooling element to dissipate heat that is generated from the plurality of memory devices, the plurality of protrusions being in a pattern to dissipate the heat that is generated from the plurality of memory devices using a plurality of heat conducting elements located underneath the plurality of protrusions, wherein a heat conducting element of the plurality of heat conducting elements is based on a different material than another heat conducting element of the plurality of heat conducting elements.

8. The system of claim 7, wherein the pattern corresponds to an offset grid pattern.

9. The system of claim 7, wherein the pattern comprises a portion that is located above a respective memory device of the plurality of memory devices and another portion that is located above a separation between a pair of memory devices of the plurality of memory devices, and wherein the pattern corresponds to protrusions being located at the portion that is located above the respective memory device and no protrusions being located at the another portion that is located above the separation between the pair of memory devices.

10. The system of claim 7, wherein the thermal cooling element further comprises:
a thermal adhesive layer corresponding to the planar surface, the thermal adhesive layer being coupled to the top surface of each of the plurality of memory devices.

11. The system of claim 10, wherein the heat conducting element of the plurality of heat conducting elements is based on a different pattern than another heat conducting element of the plurality of heat conducting elements.

12. The system of claim 7, wherein the thermal cooling element corresponds to at least one of copper tape, aluminum tape, steel tape or carbon tape.

13. A heatsink for a memory sub-system, the heatsink comprising:
a thermal cooling element comprising a bottom surface that is coupled to a top surface of each of a plurality of memory devices of the memory sub-system, and wherein the thermal cooling element further comprises a top surface and a plurality of protrusions connected to the top surface and extending above the top surface of the thermal cooling element, the plurality of protrusions to dissipate heat that is generated from the plurality of memory devices of the memory sub-system using a plurality of heat conducting elements located underneath the plurality of protrusions, wherein a heat conducting element of the plurality of heat conducting elements is based on a different material than another heat conducting element of the plurality of heat conducting elements.

14. The heatsink of claim 13, wherein the plurality of protrusions are arranged in an offset grid pattern.

15. The heatsink of claim 13, wherein the top surface of the thermal cooling element comprises a portion that is located above a respective memory device of the plurality of memory devices and another portion that is located above a separation between a pair of memory devices of the plurality of memory devices, and wherein the plurality of protrusions are arranged in a pattern that corresponds to protrusions being located at the portion that is located above the respective memory device and no protrusions being located at the another portion that is located above the separation between the pair of memory devices.

16. The heatsink of claim 13, wherein the heatsink further comprises:
   a thermal adhesive layer that is coupled to a top surface of each of the plurality of memory devices.

17. The heatsink of claim 13, wherein the thermal cooling element corresponds to at least one of copper tape, aluminum tape, steel tape or carbon tape.

18. The heatsink of claim 13, wherein the heat conducting element of the plurality of heat conducting elements is based on a different material or pattern than another heat conducting element of the plurality of heat conducting elements.

\* \* \* \* \*